(12) United States Patent
Olgaard et al.

(10) Patent No.: US 9,003,253 B2
(45) Date of Patent: Apr. 7, 2015

(54) METHOD FOR TESTING DATA PACKET SIGNAL TRANSCEIVER USING COORDINATED TRANSMITTED DATA PACKET SIGNAL POWER

(71) Applicant: Litepoint Corporation, Sunnyvale, CA (US)

(72) Inventors: Christian Volf Olgaard, Saratoga, CA (US); Ruizu Wang, San Ramon, CA (US); Guang Shi, San Jose, CA (US)

(73) Assignee: Litepoint Corporation, Sunnyvale, CA (US)

( * ) Notice: Subject to any disclaimer, the term of this patent is extended or adjusted under 35 U.S.C. 154(b) by 127 days.

(21) Appl. No.: 13/972,280

(22) Filed: Aug. 21, 2013

(65) Prior Publication Data

US 2015/0058691 A1 Feb. 26, 2015

(51) Int. Cl.
*G01R 31/3183* (2006.01)
*G01R 31/319* (2006.01)
*G01R 31/317* (2006.01)
*H04W 24/06* (2009.01)

(52) U.S. Cl.
CPC ...... *G01R 31/319* (2013.01); *G01R 31/318371* (2013.01); *G01R 31/31725* (2013.01); *H04W 24/06* (2013.01)

(58) Field of Classification Search
CPC .................. G01R 31/318371; G01R 31/31725; H04W 24/06
See application file for complete search history.

(56) References Cited

U.S. PATENT DOCUMENTS

| | | | | |
|---|---|---|---|---|
| 7,065,155 | B2* | 6/2006 | Kaczynski | 375/297 |
| 7,206,549 | B2* | 4/2007 | Lin et al. | 455/67.11 |
| 7,480,840 | B2* | 1/2009 | Hathorn et al. | 714/724 |
| 8,042,004 | B2* | 10/2011 | Ing et al. | 714/43 |
| 2003/0169700 | A1* | 9/2003 | Nilsson | 370/318 |
| 2004/0187049 | A1 | 9/2004 | West | |
| 2004/0203466 | A1 | 10/2004 | Kiukkonen et al. | |
| 2005/0176376 | A1* | 8/2005 | Liu | 455/67.16 |
| 2007/0091814 | A1* | 4/2007 | Leung et al. | 370/252 |
| 2007/0223438 | A1* | 9/2007 | Bennett | 370/338 |
| 2008/0287117 | A1* | 11/2008 | Olgaard et al. | 455/423 |
| 2009/0092053 | A1* | 4/2009 | Olgaard | 370/241 |
| 2011/0243006 | A1 | 10/2011 | Itagaki et al. | |
| 2012/0113829 | A1* | 5/2012 | Olgaard et al. | 370/252 |
| 2012/0207030 | A1* | 8/2012 | Luong | 370/245 |
| 2013/0028100 | A1 | 1/2013 | Olgaard | |

OTHER PUBLICATIONS

International Search Report and Written Opinion in PCT/US2014/046628 issued on Nov. 20, 2014, 9 pages.

(Continued)

*Primary Examiner* — Steve Nguyen
(74) *Attorney, Agent, or Firm* — Vedder Price P.C.

(57) ABSTRACT

A method for testing a data packet signal transceiver device under test (DUT) that minimizes time lost due to waiting for respective power levels of data packets transmitted by the DUT to settle at the desired nominal value for transmit signal testing. In accordance with exemplary embodiments, signals transmitted by the DUT during receive signal testing, e.g., as acknowledgement data packets, are transmitted at the nominal value for transmit signal testing, thereby allowing sufficient time for individual data packet signal power levels to settle and remain consistent at the nominal value by the time receive signal testing is completed and transmit signal testing is to begin.

14 Claims, 8 Drawing Sheets

(56) References Cited

OTHER PUBLICATIONS

U.S. Appl. No. 13/462,459, filed May 2, 2012, "System and Method for Initiating Testing of Multiple Communication Devices"; 18 Pages.

U.S. Appl. No. 13/716,369, filed Dec. 12, 2012, "System and Method for Parllel Testing of Multiple Data Packet Signal Transceivers"; 24 Pages.

* cited by examiner $T = t_{rx} + t_w + t_m$

METHOD FOR TESTING DATA PACKET SIGNAL TRANSCEIVER USING COORDINATED TRANSMITTED DATA PACKET SIGNAL POWER

BACKGROUND

The present invention relates to testing data packet signal transceivers, and in particular, to achieve faster test times by coordinating transmitted data packet signal powers to ensure settled output signal powers when measuring data packet signal characteristics.

Many of today's electronic devices use wireless technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless technologies must adhere to various wireless technology standard specifications.

When designing such wireless devices, engineers take extra care to ensure that such devices will meet or exceed each of their included wireless technology prescribed standard-based specifications. Furthermore, when these devices are later being manufactured in quantity, they are tested to ensure that manufacturing defects will not cause improper operation, including their adherence to the included wireless technology standard-based specifications.

For testing these devices following their manufacture and assembly, current wireless device test systems (also referred to as "testers") employ a subsystem for analyzing signals received from each device. Such subsystems typically include at least a vector signal generator (VSG) for providing the source signals to be transmitted to the device under test, and a vector signal analyzer (VSA) for analyzing signals produced by the device under test. The production of test signals by the VSG and signal analysis performed by the VSA are generally programmable so as to allow each to be used for testing a variety of devices for adherence to a variety of wireless technology standards with differing frequency ranges, bandwidths and signal modulation characteristics.

As part of the manufacturing of wireless communication devices, one significant component of production cost is costs associated with manufacturing tests. Typically, there is a direct correlation between the cost of test and the time required to perform the test. Thus, innovations that can shorten test time without compromising test accuracy or increasing equipment costs (e.g., increasing costs due to increasing sophistication of necessary test equipment, or testers) are important and can provide significant costs savings, particularly in view of the large numbers of such devices being manufactured and tested.

As is well known, testing of wireless transceivers typically involves combinations of receiver (RX) and transmitter (TX) testing. Generally, there are no prescribed methods or requirements in terms of ordering or sequences of receiver and transmitter tests. For example, all receiver tests could be performed first followed by all transmitter tests, or vice versa. Indeed, it has been found that overall test time, e.g., the overall time required to do all standard-prescribed receiver and transmitter tests, can vary significantly, depending upon how the receiver and transmitter test are ordered, organized and performed.

For example, during transmitter testing where the device under test (DUT) is transmitting test data packets to a tester, during signal switching periods or whenever there is a change in signal frequency or power level, a time interval of output signal instability exists, during which the transmitter output power varies over some range of values as the output circuitry settles into its steady-state operation. Accordingly, following such a signal switching episode, a typical transmitter test procedure will disregard a number of the initially transmitted data packets so as to avoid false negatives caused by instabilities rather than by what may otherwise be perceived as a failure of the DUT. This time during which these initially transmitted test data packets are sent and ignored adds, sometimes significantly, to the overall test time. For example, in some instances, the time lost ignoring test data packets can be equal to or greater than the actual time necessary for the sequence of test data packets used to actually perform the intended test.

Accordingly, it would be desirable to have a technique for testing data transceivers in which time otherwise wasted for awaiting power settling of a transmitted data signal can be used for performing useful tasks associated with the test to be performed. Additionally, if such testing method could be applied to multiple DUTs for simultaneous testing, further time savings could be achieved.

SUMMARY

In accordance with the presently claimed invention, a method is provided for testing a data packet signal transceiver device under test (DUT) that minimizes time lost due to waiting for respective power levels of data packets transmitted by the DUT to settle at the desired nominal value for transmit signal testing. In accordance with exemplary embodiments, signals transmitted by the DUT during receive signal testing, e.g., as acknowledgement data packets, are transmitted at the nominal value for transmit signal testing, thereby allowing sufficient time for individual data packet signal power levels to settle and remain consistent at the nominal value by the time receive signal testing is completed and transmit signal testing is to begin.

In accordance with one embodiment of the presently claimed invention, a method of testing a data packet signal transceiver device under test (DUT) includes:
  receiving, with a DUT during a first plurality of portions of a first time interval, a tester data packet signal including a plurality of tester data packets;
  transmitting, with the DUT during a second plurality of portions of the first time interval, a first DUT data packet signal having a nominal DUT signal power and including a plurality of first DUT data packets, wherein
    respective ones of the first and second pluralities of portions of the first time interval are mutually alternating,
    each one of the plurality of first DUT data packets corresponds to a respective one of at least a portion of the plurality of tester data packets, and
    each one of at least a portion of the plurality of first DUT data packets has a respective one of a plurality of first DUT data packet powers substantially unequal to the nominal DUT signal power; and
  transmitting, with the DUT during a second time interval following the first time interval, a second DUT data packet signal having the nominal DUT signal power and including a plurality of second DUT data packets each one of which has a respective one of a plurality of second DUT data packet powers substantially equal to the nominal DUT signal power.

In accordance with another embodiment of the presently claimed invention, a method of operating a data packet signal transceiver tester for testing a data packet signal transceiver device under test (DUT) includes:

transmitting, with a tester during a first plurality of portions of a first time interval, a tester data packet signal including a plurality of tester data packets;

receiving, with the tester during a second plurality of portions of the first time interval, a first DUT data packet signal having a nominal DUT signal power and including a plurality of first DUT data packets, wherein respective ones of the first and second pluralities of portions of the first time interval are mutually alternating, each one of the plurality of first DUT data packets corresponds to a respective one of at least a portion of the plurality of tester data packets, and each one of at least a portion of the plurality of first DUT data packets has a respective one of a plurality of first DUT data packet powers substantially unequal to the nominal DUT signal power; and receiving, with the tester during a second time interval following the first time interval, a second DUT data packet signal having the nominal DUT signal power and including a plurality of second DUT data packets each one of which has a respective one of a plurality of second DUT data packet powers substantially equal to the nominal DUT signal power.

DETAILED DESCRIPTION

Figure 1:
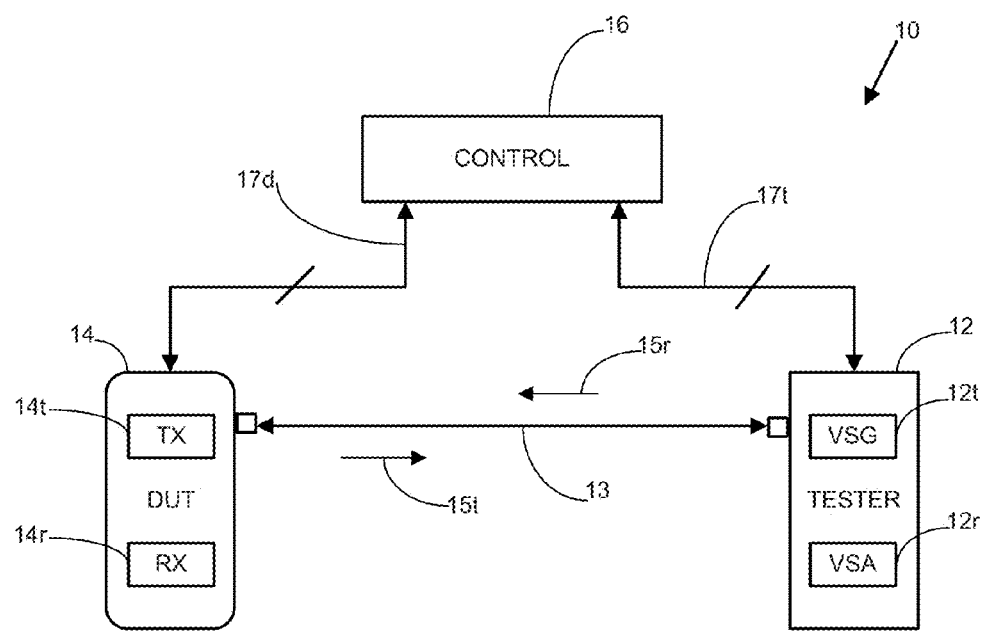
FIG. 1 depicts a testing environment and signal diagram in which transmitted signal power varies due to transmitter signal power settling.
Figure 1:
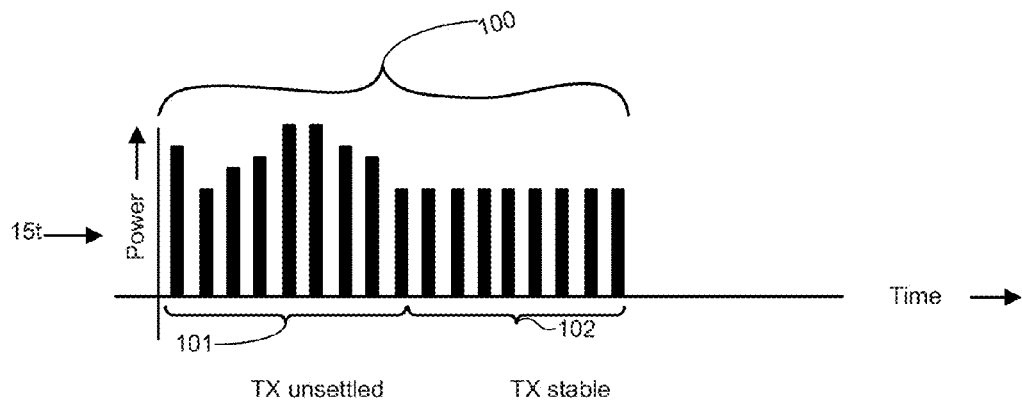

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

Wireless devices, such as cellphones, smartphones, tablets, and the like, all make use of standards-based wireless signal technologies, such as: IEEE 802.11a, b, g, n, ac; 3GPP LTE; and Bluetooth. The standards that underlie these technologies are designed to provide reliable wireless connectivity or communications, and prescribe physical and higher-level specifications that are generally chosen to be highly energy efficient and to minimize interference among devices using the same or other technologies that are adjacent to or share the wireless spectrum.

Tests prescribed by these standards are meant to ensure that such devices are designed to conform to standard-prescribed specifications and that manufactured devices continue to conform to those prescribed specifications. Most devices are transceivers, containing at least one or more (each) receivers and transmitters. Thus, tests will determine whether both receivers and transmitters of a device under test (DUT) conform. Tests of a DUT's receiver or receivers are RX tests, and typically involve sending of test packets by a test system, or tester, to the receiver(s) and some means of determining how the DUT's receiver(s) respond to those test packets. A DUT's transmitters are tested by having them send packets to the test system, which then evaluates the physical characteristics of the signals sent by the devices.

The RX test packets are generated by the test system (e.g., a VSG) and the TX test packets are generated by the DUT and evaluated by a test system's analysis subsystem (e.g., a VSA).

In the case of RX tests, some standards, such as IEEE 802.11a, b, g, n and ac, require that a device that receives a good packet confirm its receipt by sending a confirmation (e.g., ACK) packet back to the sending device, which in a test environment is the test system. Thus, a test system sending test packets that fall within prescribed frequency, power and modulation characteristics, and whose data are consistent with an appended checksum, would expect to receive a confirmation packet each time one is sent. A standard will prescribe some worst-case number of missed packets that still falls within acceptable limits. So, if a tester sent X test packets, and received Y confirmation packets, once some minimum number of packets were exchanged, the packet error rate (PER), for example, could be computed. In general, the data rate at which confirmation packets are sent is chosen to optimize the likelihood of being received. The power level of a confirmation packet can also be selected.

During a TX test, a device sends test packets to a test system, which, in turn, analyzes the received test packets for a variety of physical characteristics, such as frequency, power, modulation, and a quality metric, such as error vector magnitude (EVM). When a device's transmitter is turned on or after changing frequency or transmit power level, and begins sending, there is a time interval during which the transmitter power output will vary over a range of values, thus making it unacceptable to use for analysis, as the packets do not represent normal signal behavior. Therefore, most test programs allow for a period of initial test packet sending that ignores those packets until a transmitter is likely to have settled. That settling wait time can be longer than the actual test time, thereby extending test time and decreasing test efficiency.

As discussed in more detail below, in accordance with exemplary embodiments of the presently claimed invention, time previously lost while awaiting settling of a transmitter signal power (e.g., when a DUT transmitter is first turned on or is set at a new power level) is used for performing other aspects of desired or required testing. Further, when used in conjunction with parallel testing of multiple DUTs, further time savings can be realized.

For example, in accordance with exemplary embodiments, when a tester is sending test data packets to a DUT during a receiver test, the DUT, in accordance with protocol or programming, confirms receipt of each test data packet by responding with a confirmation data packet, e.g., an acknowledgement (ACK) data packet. Such confirmation data packet from the DUT is, from the perspective of the DUT, a transmitted data packet. Accordingly, it can be used to initiate settling time of the DUT transmitter to the desired power level. By coordinating the timing, or sequencing, of receiver and transmitter (of the DUT) testing, and by adjusting the confirmation data packet (transmitted by the DUT) power levels to be transmitted at the desired transmitter power level of the upcoming transmitter test, settling of the DUT transmitter can be initiated during its receiver test, thereby resulting in power-settled transmitter (of the DUT) data packets which are available for immediate use in tests with little or no risk of power level variations or instabilities being erroneously perceived as DUT data packet errors.

Accordingly, since the power levels of confirmation data packets are of no test consequence, the confirmation data packets can be used to initiate settling of the DUT transmitter power, and thereby allow for immediate performance of the transmitter test sequence following completion of the receiver test, without delays previously needed for allowing DUT transmitter power to settle. Further, where multiple DUTs are being tested in parallel, following completion of the receiver test of the last DUT, the transmitters of all DUTs can be enabled for sending transmitter test data packets to the tester. While transmitter test data packets from the respective DUTs are captured sequentially, since all the DUTs have begun transmitting, no allowance for settling time will be needed between sequential captures of DUT data packets. Hence, test time can be reduced by initiating DUT transmitter settling time during DUT receiver testing, and further reduce by parallel receiver testing of multiple DUTs.

Referring to FIG. 1, a test environment 10 for testing a wireless data packet transceiver includes a tester 12, the DUT 14 and a control system 16, such as a personal computer or the like. The tester will include a source for transmitted test data packets, such as a VSG 12t, and a receiver, such as a VSA 12r, for receiving and analyzing or processing data packets received from the DUT 14. Similarly, the DUT 14 includes a transmitter 14t for sending data packets and a receiver 14r for receiving data packets.

The tester 12 and DUT 14 communicate with the control system 16 via respective control interfaces 17t, 17d (e.g., multiple-conductor cables or networks) through which they exchange respective test commands or instructions, and test data.

The tester 12 and DUT 14 typically communicate via a conductive radio frequency (RF) signal path 13 (e.g., coaxial cable and connectors) via which receive data packets 15r are conveyed from the tester 12 to the DUT 14, and transmit data packets 15t are conveyed from the DUT 14 to the tester 12.

As depicted in the signal diagram, during an initial portion 101 of a transmit time interval 100, the transmitted DUT data packets 15t have a power level that varies over a relatively wide power range, e.g., due to settling of the output power amplifier circuitry, as discussed above. Once the transmitter has settled, the transmitted data package during a subsequent portion 102 of the transmit time interval 100 will be substantially constant, e.g., varying over a much narrower power range that is within specified tolerances of the applicable signal standard and is indicative of steady state transmitter operation.

Figure 2:
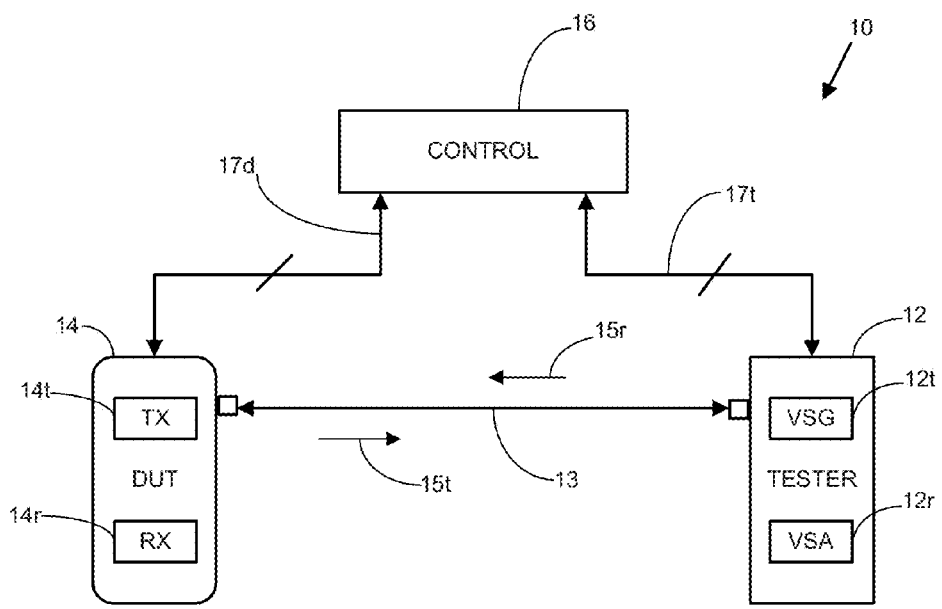
FIG. 2 depicts a similar test environment and signal diagram in which variances in signal power can be seen when switching the transmitter power multiple times.
Figure 2:
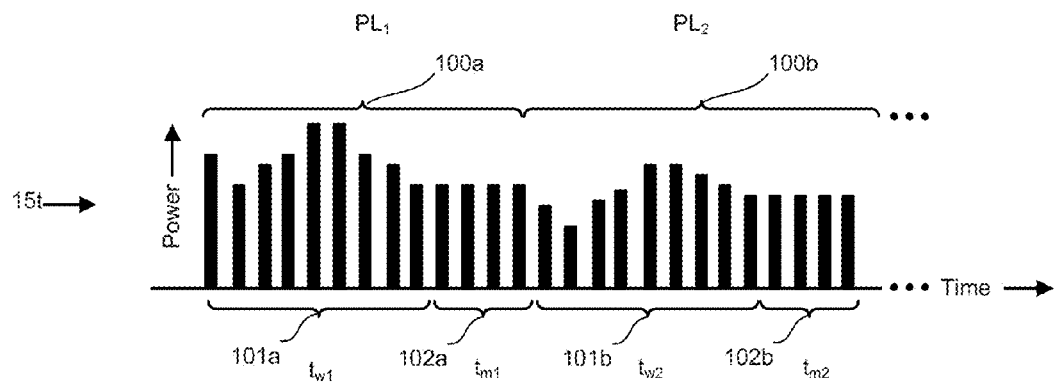

Referring to FIG. 2, these variations in transmitted DUT signal 15t power occur during each time interval 100a, 100b, . . . in which the transmitted signal power is changed. For example, during a time interval 100a when the transmitted signal power is set to a selected nominal power level PL1, the individual data packets have varying power levels during an initial portion 101a of this time interval 100a. Subsequently, the power level settles at the intended nominal power level PL1 during a later portion 102a of this time interval 100a. Similarly, during a second time interval 100b, the transmit power level is reset to a second nominal power level PL2. As before, the transmitted signal power level varies during an initial portion 101b of this time interval 100b, following which, during a later portion 102b of this time interval 100b, the power level settles at the intended nominal power level PL2.

Using conventional test methods, the data packets having varying power levels during the initial portions 101a, 101b of these testing intervals 100a, 100b will be ignored as the tester 12 awaits settling of the power levels to their nominal values PL1, PL2. Hence, these elapsed time intervals 101a, 101b are lost, since no test measurements are made. Capturing of test data packets only occur during the later time interval portions 102a, 102b. In many instances, the lost time 101a, 101b can be longer, perhaps significantly, than the actual test time intervals 102a, 102b.

Figure 3:
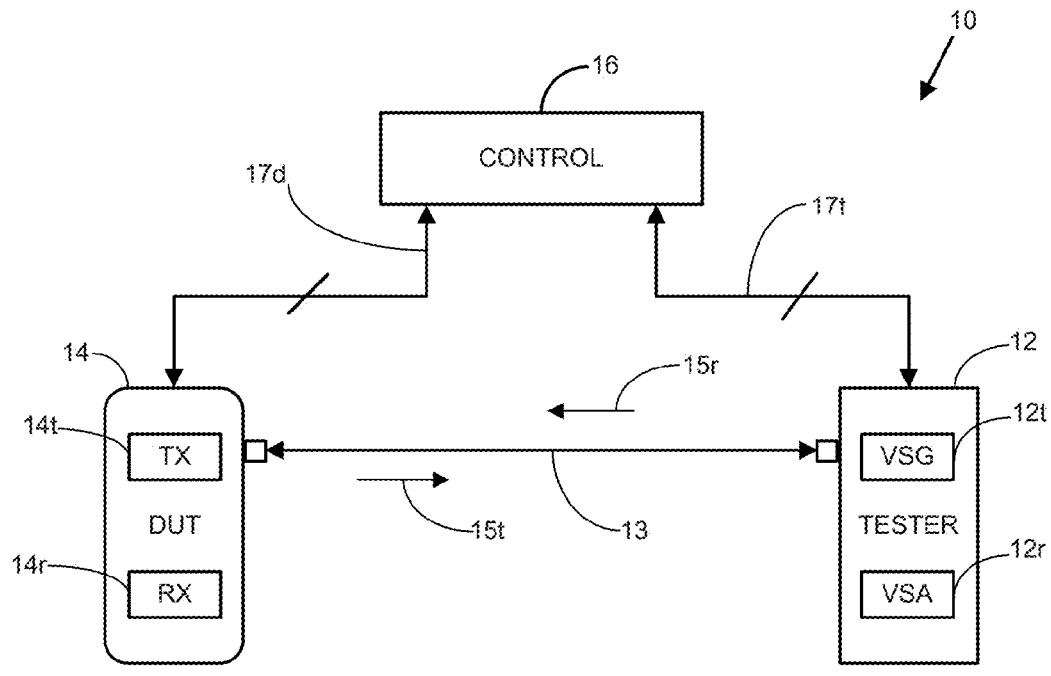
FIG. 3 depicts a similar test environment and signal diagram in which signal power of confirmation data packets, transmitted in response to test data packets, vary before settling.
Figure 3:
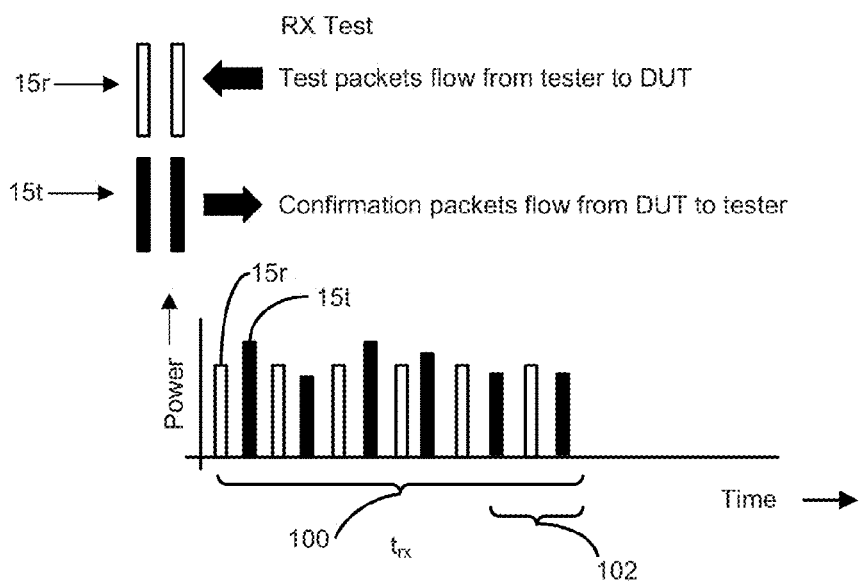

Referring to FIG. 3, as discussed above, during a receiver test, test data packets 15r flow from the tester 12 to the DUT 14. In response, for each test data packet received correctly (e.g., recognized as a valid data packet) by the DUT 14, a confirmation data packet 15t flows from the DUT 14 to the tester 12. This process of the tester sending test data packets, the DUT correctly receiving test data packets, and the DUT sending confirmation data packets continues (with the tester and DUT sending their test data packets and confirmation data packets, respectively, during mutually alternating portions of the receiver test) until a prescribed number of data packets have been sent or confirmation data packets have been received (by the tester 12). Also as discussed above, during the earlier portion 101 of this test time 100, the confirmation data packets 15t transmitted by the DUT 14 vary in signal power levels due to settling of the transmitter circuitry. During a later portion 102 of this test time 100, the power level will have settled.

Figure 4:
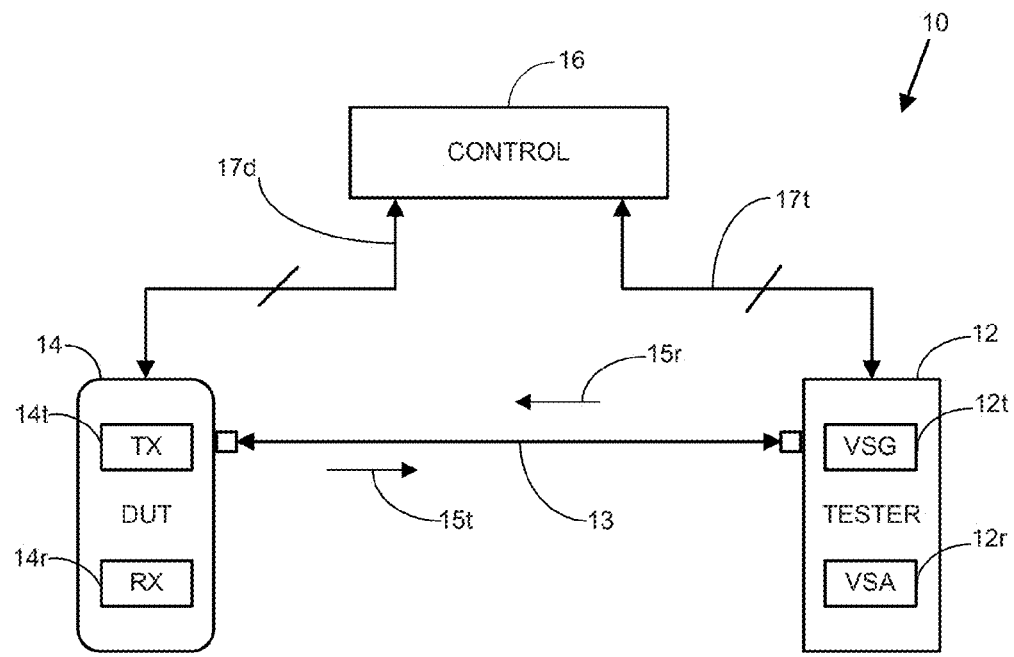
FIG. 4 depicts a similar test environment and signal diagram in which a receiver test is followed by a transmitter test performed at a different power level.
Figure 4:
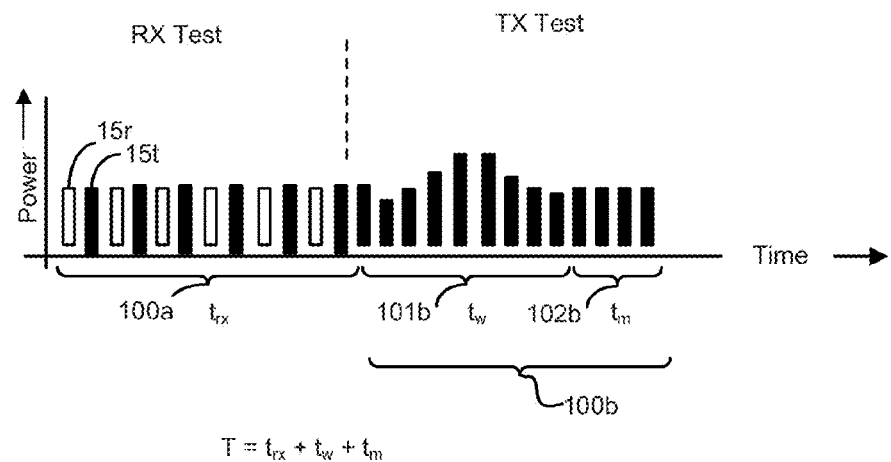

Referring to FIG. 4, when a conventional receiver test is followed by a transmitter test, the receiver test time 100a will be followed by a settling time 101b preceding the transmitter test time 102b that occurs once power settling has completed. As a result, overall test time for the two tests will be equal to the sum of the receiver test time 100a, the power settling time 101b, and the transmitter test time 102b. As depicted here, the power settling time 101b can be longer than the actual transmitter test time 102b, in which case time lost waiting for power settling and during which no measurements are made can be significant.

Figure 5:
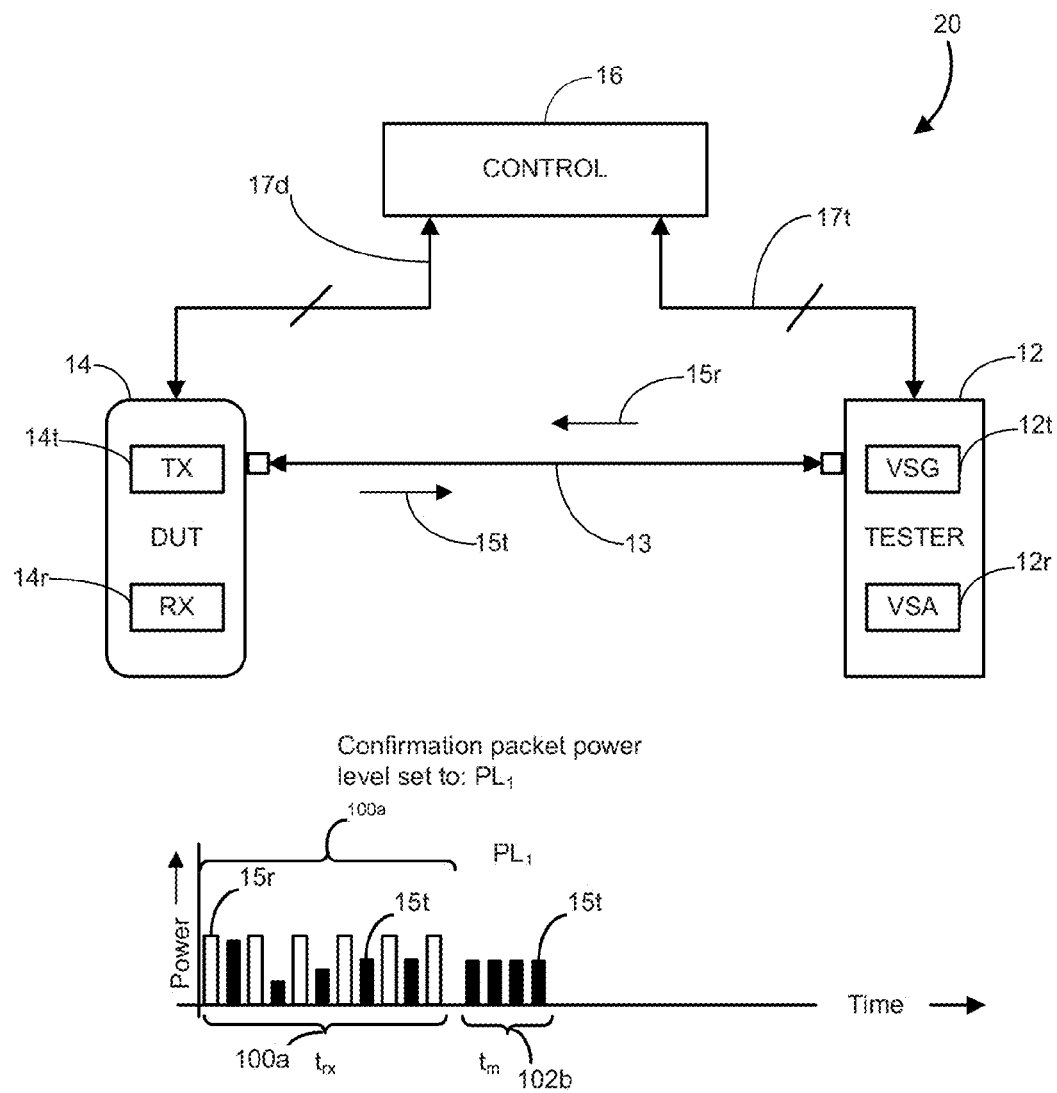
FIG. 5 depicts a test environment and signal diagram in accordance with an exemplary embodiment of the presently claimed invention.

Referring to FIG. 5, in accordance with exemplary embodiments, the desired nominal power level of the responsive confirmation data packets 15t to be transmitted by the DUT 14 during the receiver test time 100a can be set to the power level PL1 desired for the upcoming transmitter test time 102b, e.g., immediately following the receiver test. Accordingly, during the receiver test time interval 100a, the output power of the DUT transmitter 14t will vary and then settle at the desired nominal power level PL1. Accordingly, testing DUT data packets 15t during the transmit test time interval 102b can begin immediately, since the DUT transmitter power has already settled at the desired nominal power level. Hence, the total test time is now the sum of only the receiver test time 100a and transmitter test time 102b, without the additional time lost for the settling time interval 101b (FIG. 4).

Figure 6:
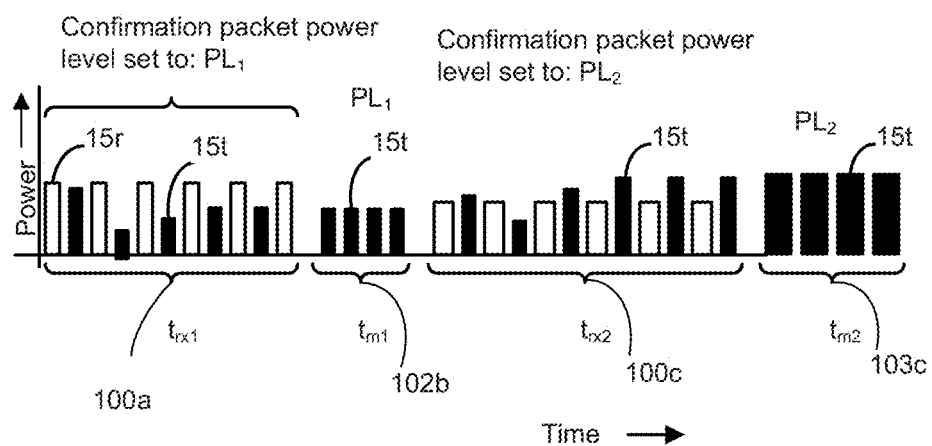
FIG. 6 depicts a signal diagram for testing a wireless DUT in accordance with another exemplary embodiment of the presently claimed invention.

Referring to FIG. 6, this technique can also be used where a sequence of receiver tests are interleaved with a sequence of transmitter test such that, during each receiver test sequence, the confirmation data packet power level is chosen to be equal to the desired nominal data packet power level for an upcoming, e.g., immediately subsequent, DUT transmitter test. For example, during a first receiver test time interval 100a, the power level for the confirmation data packets 15t is set at the nominal power level PL1 desired for the subsequent transmitter test time 102b. Similarly, during a later receiver test time interval 100c, the power level of the confirmation data packets 15t is set at a second nominal power level PL2 to be used during the subsequent transmitter test time interval 103c. Again, overall test time is shortened due to the elimination of lost time waiting for power settling, since power settling of the DUT transmitter occurs earlier during the receiver test time intervals 100a, 100c.

As depicted here, two different DUT transmitter power levels are depicted with different packet duration (data rate) to be tested with two different DUT receive data rates and power levels. Also, in cases where the number of data packets in a receiver packet error rate (PER) test exceeds the typical transmitter settling time, the confirmation data packet power levels can be changed such that a subsequent transmitter test at different power levels can occur in tandem during ensuing receiver PER tests. For example, if 200 data packets are needed to perform a receiver test and the DUT 14 requires 100 packets for settling at each power level, half of the receiver test can be executed during the settling of the first transmitter power level followed by a transmitter test at such first transmitter power level, in turn, followed by the remainder of the receiver test can be executed during the settling of the second transmitter power level followed by a second transmitter test at such second transmitter power level. The two PER test results can be combined to produce a single test result for the full 200 packet PER test.

Figure 7:
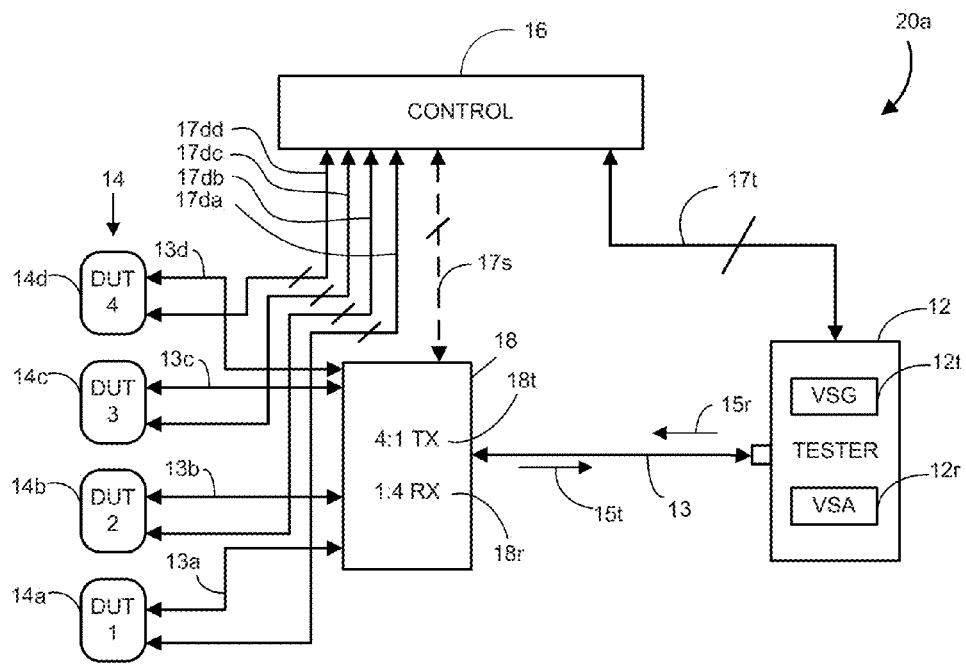
FIG. 7 depicts a test environment and signal diagram for testing multiple DUTs in accordance with another exemplary embodiment of the presently claimed invention.
Figure 7:
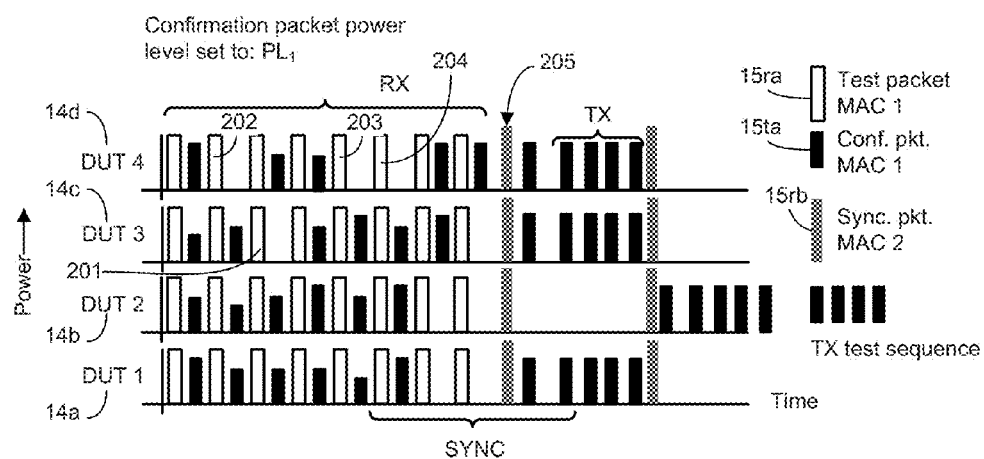

Referring to FIG. 7, even greater test time reductions can be realized by performing parallel receiver tests followed by simultaneous transmitter test with sequential capture and analysis. To achieve this, an alternative test environment 20a is used in which multiple DUTs 14 (with corresponding control interfaces 17da, 17db, 17dc, 17dd with the control systems 16) communicate with the tester 12 by way of signal routing circuitry 18 capable of providing 4:1 signal combining 18t and 1:4 signal replication or splitting 18r (e.g., circuitry providing signal summing in the transmit direction and signal dividing in the received direction). An additional control interface 17s can be provided as needed for any signal routing circuitry 18 needing control (e.g., switch control signals for signal switches). For purposes of this discussion, an example using four DUTs 14a, 14b, 14c, 14d is used. However, more or fewer DUTs can be accommodated as desired.

Following initialization and synchronization procedures (not depicted here but performed in accordance with well-known principles), the DUTs 14a, 14b, 14c, 14d begin receiving test data packets 15r from the tester 12 and, if correctly received, respond with corresponding confirmation data packets 15t. As depicted in the signal diagram, the third DUT 14c fails to receive a data packet 201 and, therefore, sends no corresponding confirmation data packet. Similarly, the fourth DUT 14d fails to receive three data packets 202, 203 and, therefore, sends no corresponding confirmation data packets. Meanwhile, the remaining DUTs 14a, 14b have received all test data packets 15r and, therefore, complete their receiver testing before the other DUTs 14c, 14d.

Then, to ensure that all DUTs 14 begin their transmitter testing concurrently, a synchronization operation 205 is introduced following the receiver test. This synchronization operation 205 uses synchronization data packets 15rb with a media access control (MAC) address that is different from the MAC address used during the receiver testing. In response, one or more of the DUTs 14 respond to this synchronization data packet 15rb with corresponding confirmation data packets 15t, while other DUTs do not. Techniques for synchronizing multiple DUTs using different MAC addresses and selective corruption of data packets are described in more detail in U.S. patent application Ser. No. 13/462,459, the contents of which are incorporated herein by reference.

Once all DUTs 14 have correctly received the synchronization data packet 15rb and responded with corresponding confirmation data packets, all DUTs 14 can then begin sending simultaneous sets of transmitter test data packets 15t, since all DUTs 14 will have had their respective output signal powers settled during their respective parallel receiver tests and require no time delay to allow for power settling before commencing with transmitter testing. Although all DUTs 14 are sending transmitter test data packets, the tester 12 with its single analysis subsystem 12r is able to capture DUT transmitter data packets sequentially due to the signal multiplexing capability of the signal routing circuitry 18.

Figure 8:
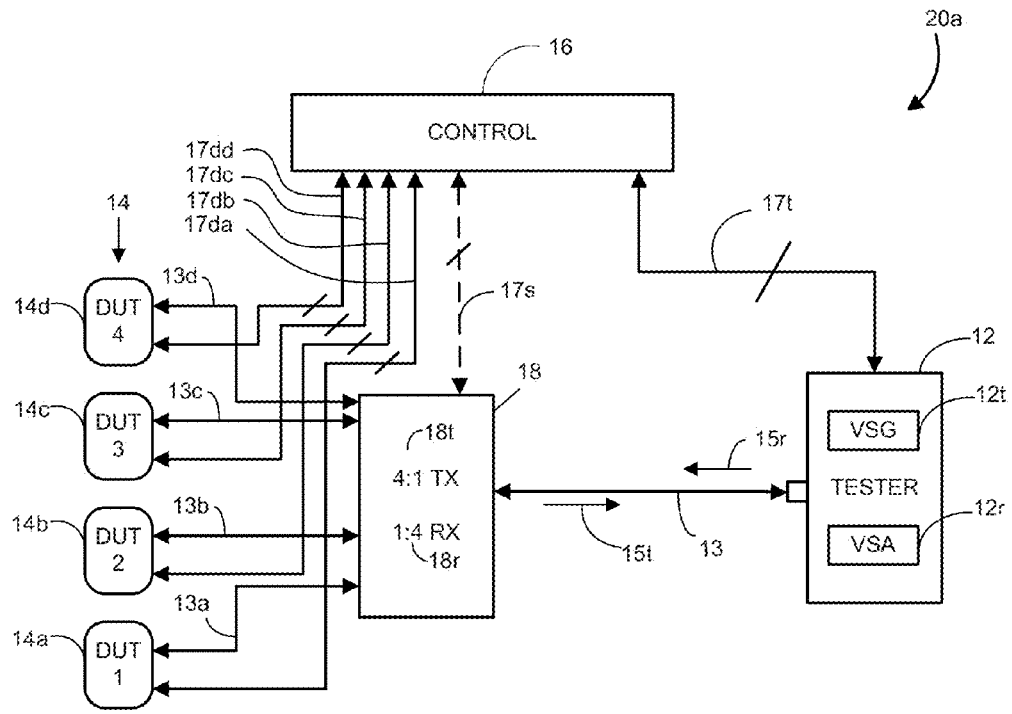
FIG. 8 depicts a test environment and signal diagram for testing multiple DUTs in accordance with another exemplary embodiment of the presently claimed invention.
Figure 8:
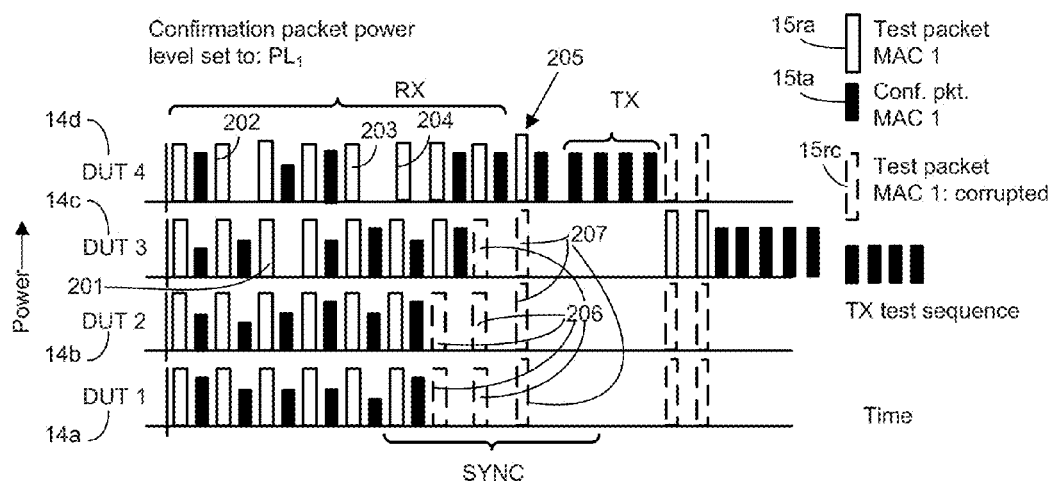

Referring to FIG. 8, in accordance with another exemplary embodiment, this alternative testing environment 20a can be operated to perform the desired synchronization between the DUTs 14 and tester 12 without needing to change MAC addresses within the DUT receivers 14r. For example, rather than using different MAC addresses, as discussed above, packet corruption is introduced into test data packets 206 following successful captures by DUTs 14a, 14b, 14c of a specified number of test data packets. Meanwhile, non-corrupt tets data packets continue being conveyed to DUTs 14d that have not yet successfully captured the specified number of test data packets. Following successful capturing of the specified test data packets, or when the receiver test time is otherwise considered to have been completed, a synchronization packet 205 can be conveyed to all DUTs 14, as discussed above, with selected synchronization packets 207 corrupted to prevent initiation of data packet transmission by selected DUTs 14a, 14b, 14c during testing of the DUT 14d receiving a non-corrupted synchronization packet 205. Techniques for synchronizing multiple DUTs using selective corruption of data packets are described in more detail in U.S. patent application Ser. No. 13/716,369, the contents of which are incorporated herein by reference.

Based on the foregoing discussion, it should be understood that, in accordance with exemplary embodiments of the presently claimed invention, lost test time due to transmitter power settling can be avoided by proper ordering or sequencing of receiver and transmitter tests in conjunction with setting of the power levels at which DUT confirmation data packets are transmitted. By eliminating the power settling wait time, and, in addition, performing receiver test in parallel, overall test time can be reduced, often significantly. Such test technique is also useful where testing includes sequences of transmitter data packets having different power levels. By having confirmation data packets transmitted during receiver testing set to upcoming transmitter test power levels, necessary transmitter power settling occurs concurrently with receiver testing. Accordingly, test time is shorter and, therefore, test costs are reduced.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of testing a data packet signal transceiver device under test (DUT), comprising:
   receiving, with a DUT during a first plurality of portions of a first time interval, a tester data packet signal including a plurality of tester data packets;
   transmitting, with said DUT during a second plurality of portions of said first time interval, a first DUT data packet signal having a nominal DUT signal power and including a plurality of first DUT data packets, wherein
      respective ones of said first and second pluralities of portions of said first time interval are mutually alternating,
      each one of said plurality of first DUT data packets corresponds to a respective one of at least a portion of said plurality of tester data packets, and
      each one of at least a portion of said plurality of first DUT data packets has a respective one of a plurality of first DUT data packet powers substantially unequal to said nominal DUT signal power; and
   transmitting, with said DUT during a second time interval following said first time interval, a second DUT data packet signal having said nominal DUT signal power and including a plurality of second DUT data packets each one of which has a respective one of a plurality of second DUT data packet powers substantially equal to said nominal DUT signal power.

2. The method of claim 1, wherein each one of said plurality of first DUT data packets is responsive to said respective one of at least a portion of said plurality of tester data packets.

3. The method of claim 1, wherein:
   each one of one portion of said plurality of first DUT data packets has a respective one of said plurality of first DUT data packet powers less than said nominal DUT signal power; and
   each one of another portion of said plurality of first DUT data packets has a respective one of said plurality of first DUT data packet powers greater than said nominal DUT signal power.

4. The method of claim 1, wherein each one of another portion of said plurality of first DUT data packets has a respective one of said plurality of first DUT data packet powers substantially equal to said nominal DUT signal power.

5. The method of claim 4, wherein said transmitting, with said DUT during a second plurality of portions of said first time interval, a first DUT data packet signal comprises:
   transmitting said at least a portion of said plurality of first DUT data packets during a first portion of said first time interval, and
   transmitting said another portion of said plurality of first DUT data packets during a second portion of said first time interval.

6. The method of claim 5, wherein said first and second portions of said first time interval are mutually exclusive.

7. The method of claim 1, wherein said second time interval is immediately subsequent to said first time interval.

8. A method of operating a data packet signal transceiver tester for testing a data packet signal transceiver device under test (DUT), comprising:
   transmitting, with a tester during a first plurality of portions of a first time interval, a tester data packet signal including a plurality of tester data packets;
   receiving, with said tester during a second plurality of portions of said first time interval, a first DUT data packet signal having a nominal DUT signal power and including a plurality of first DUT data packets, wherein
      respective ones of said first and second pluralities of portions of said first time interval are mutually alternating,
      each one of said plurality of first DUT data packets corresponds to a respective one of at least a portion of said plurality of tester data packets, and
      each one of at least a portion of said plurality of first DUT data packets has a respective one of a plurality of first DUT data packet powers substantially unequal to said nominal DUT signal power; and
   receiving, with said tester during a second time interval following said first time interval, a second DUT data packet signal having said nominal DUT signal power and including a plurality of second DUT data packets each one of which has a respective one of a plurality of second DUT data packet powers substantially equal to said nominal DUT signal power.

9. The method of claim 8, wherein each one of said plurality of first DUT data packets is responsive to said respective one of at least a portion of said plurality of tester data packets.

10. The method of claim 8, wherein:
   each one of one portion of said plurality of first DUT data packets has a respective one of said plurality of first DUT data packet powers less than said nominal DUT signal power; and
   each one of another portion of said plurality of first DUT data packets has a respective one of said plurality of first DUT data packet powers greater than said nominal DUT signal power.

11. The method of claim 8, wherein each one of another portion of said plurality of first DUT data packets has a respective one of said plurality of first DUT data packet powers substantially equal to said nominal DUT signal power.

12. The method of claim 11, wherein said receiving, with said tester during a second plurality of portions of said first time interval, a first DUT data packet signal comprises:
   receiving said at least a portion of said plurality of first DUT data packets during a first portion of said first time interval, and
   receiving said another portion of said plurality of first DUT data packets during a second portion of said first time interval.

13. The method of claim 12, wherein said first and second portions of said first time interval are mutually exclusive.

14. The method of claim 8, wherein said second time interval is immediately subsequent to said first time interval.

\* \* \* \* \*